United States Patent
Otterstedt et al.

(10) Patent No.: US 11,068,344 B2
(45) Date of Patent: Jul. 20, 2021

(54) CANDIDATE BIT DETECTION AND UTILIZATION FOR ERROR CORRECTION

(71) Applicant: Infineon Technologies AG, Neubiberg (DE)

(72) Inventors: Jan Otterstedt, Unterhaching (DE); Jayachandran Bhaskaran, Neufahrn (DE); Michael Goessel, Mahlow (DE); Thomas Rabenalt, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 111 days.

(21) Appl. No.: 16/352,783

(22) Filed: Mar. 13, 2019

(65) Prior Publication Data
US 2020/0293402 A1 Sep. 17, 2020

(51) Int. Cl.
*G06F 11/10* (2006.01)
*H03M 13/37* (2006.01)
*H03M 13/45* (2006.01)
*H04L 25/02* (2006.01)
*H04L 25/06* (2006.01)
*H04L 1/00* (2006.01)

(52) U.S. Cl.
CPC ......... *G06F 11/1076* (2013.01); *H03M 13/37* (2013.01); *H03M 13/451* (2013.01); *H03M 13/458* (2013.01); *H04L 1/00* (2013.01); *H04L 1/0054* (2013.01); *H04L 25/0244* (2013.01); *H04L 25/067* (2013.01)

(58) Field of Classification Search
CPC ....... H04L 1/0054; H04L 25/067; H04L 1/00; H04L 25/0244; H03M 13/451; H03M 13/453; H03M 13/458; H03M 13/37; G06F 11/1076
See application file for complete search history.

(56) References Cited

U.S. PATENT DOCUMENTS

| | | | |
|---|---|---|---|
| 2008/0133999 A1* | 6/2008 | Kondo | H03M 13/3738 714/755 |
| 2012/0005560 A1* | 1/2012 | Steiner | H03M 13/2927 714/780 |
| 2016/0049203 A1* | 2/2016 | Alrod | G06F 11/073 714/2 |
| 2018/0198468 A1* | 7/2018 | Kim | G11C 11/409 |
| 2019/0244228 A1* | 8/2019 | Turner | G06Q 30/0205 |

* cited by examiner

Primary Examiner — April Y Blair
Assistant Examiner — Sazzad Hossain
(74) Attorney, Agent, or Firm — Cooper Legal Group, LLC (57) ABSTRACT

A determination is made that error-correcting code functionality detected a first number of erroneous bits within a memory device. Bits within the memory device are evaluated to identify a subset of the bits as candidate bits. The candidate bits are evaluated to determine whether the error-correcting code functionality returns a non-error state, where no error correction is performed, based upon one or more combinations of candidate bits being inverted. Responsive to the error-correcting code functionality returning the non-error state for only one combination of the one or more combinations of candidate bits being inverted, the one combination of candidate bits is corrected.

20 Claims, 6 Drawing Sheets

CANDIDATE BIT DETECTION AND UTILIZATION FOR ERROR CORRECTION

TECHNICAL FIELD

The present disclosure relates to the field of memory devices and particularly to the use of candidate bits for error-correcting code functionality for memory devices.

BACKGROUND

Error-correcting code functionality can be implemented to protect the integrity of stored data within memory devices, such as random access memory (RAM), flash memory, resistive random-access memory (RRAM), or other types of memory devices. Error-correcting code functionality uses error-correcting code bits (check bits) that are stored along with actual data bits within a memory device. The error-correcting code bits are used by the error-correcting code functionality when reading data bits to detect and/or correct erroneous (faulty) bits. An erroneous bit may correspond to a bit that has an incorrect value and thus should be corrected, such as being flipped from a logical "0" to a logical "1" or from a logical "1" to a logical "0".

One type of error-correcting code functionality is single error correcting and single error detecting functionality. Single error correcting and single error detecting functionality is able to detect and correct exactly one erroneous bit out of a set of bits. However, single error correcting and single error detecting functionality is unable to detect more than one erroneous bit out of the set of bits and is unable to correct more than one erroneous bit out of the set of bits. Another type of error-correcting code functionality is single error correcting and double error detecting functionality. Single error correcting and double error detecting functionality is able to detect up to two erroneous bits out of a set of bits, and is able to correct up to one erroneous bit out of the set of bits. However, single error correcting and double error detecting functionality is unable to detect more than two erroneous bits out of the set of bits, and is unable to correct more than one erroneous bit out of the set of bits. Other types of error-correcting code functionality relate to double error correcting and double error detecting functionality, double error correcting and triple error detecting functionality, etc.

Error-correcting code functionality improves the reliability and quality of integrated circuits and memory devices used by those integrated circuits. This is because the error-correcting code functionality can detect and correct erroneous bits that otherwise could result in data corruption. This will reduce the failure rate of such integrated circuits and improve the reliability of applications that store data within the memory devices. However, error-correcting code functionality uses additional logic and error-correcting code bits. Further, error-correcting code functionality is limited in the amount of erroneous bits that can be detected and that can be corrected.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a method is provided for identifying and using candidate bits for error-correcting code functionality. The method includes determining that the error-correcting code functionality detected a first number of erroneous bits within a memory device, where the error-correcting code functionality can correct fewer than the first number of erroneous bits. The method includes evaluating bits within the memory device to at least one of use or identify a subset of bits within the memory device as candidate bits. The method includes evaluating the candidate bits to determine whether the error-correcting code functionality returns a non-error state, where no error correction is performed, based upon one or more combinations of candidate bits being inverted. The method includes determining whether the error-correcting code functionality returns the non-error state for only one combination of candidate bits being inverted. The method includes correcting the one combination of candidate bits based upon determining that the non-error state was returned for only the one combination.

In an embodiment of the techniques presented herein, an apparatus is provided for identifying and using candidate bits for error-correcting code functionality. The apparatus includes means for determining that the error-correcting code functionality detected a first number of erroneous bits within a memory device, where the error-correcting code functionality can correct fewer than the first number of erroneous bits. The apparatus includes means for evaluating bits within the memory device to at least one of use or identify a subset of bits within the memory device as candidate bits. The apparatus includes means for evaluating the candidate bits to determine whether the error-correcting code functionality returns a non-error state, where no error correction is performed, based upon one or more combinations of candidate bits being inverted. The apparatus includes means for determining whether the error-correcting code functionality returns the non-error state for only one combination of candidate bits being inverted. The apparatus includes means for correcting the one combination of candidate bits based upon determining that the non-error state was returned for only the one combination.

In an embodiment of the techniques presented herein, a non-transitory machine readable medium comprising instructions for performing a method for identifying and using candidate bits for error-correcting code functionality is provided. The method includes determining that the error-correcting code functionality detected a first number of erroneous bits within a memory device, where the error-correcting code functionality can correct fewer than the first number of erroneous bits. The method includes evaluating bits within the memory device to at least one of use or identify a subset of bits within the memory device as candidate bits. The method includes evaluating the candidate bits to determine whether the error-correcting code functionality returns a non-error state, where no error correction is performed, based upon one or more combinations of candidate bits being inverted. The method includes determining whether the error-correcting code functionality returns the non-error state for only one combination of candidate bits being inverted. The method includes correcting the one combination of candidate bits based upon determining that the non-error state was returned for only the one combination.

In an embodiment of the techniques presented herein, a device is provided for identifying and using candidate bits for error-correcting code functionality. The device is configured to determine that the error-correcting code functionality detected a first set of erroneous bits within a memory device. The device is configured to evaluate bits within the memory device to at least one of use or identify a subset of bits within the memory device as candidate bits. The device is configured to determine whether the first set of erroneous bits are candidate bits. The device is configured to determine a likelihood that the error-correcting code functionality incorrectly detected the first set of erroneous bits based upon a threshold number of the first set of erroneous bits not being candidate bits.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

A. Introduction

Within the field of electronics, error-correcting code functionality is used to improve the reliability and quality of memory devices. Error-correcting code functionality can be implemented for any type of memory device, such as a non-volatile memory device, a random access memory (RAM), flash memory, resistive random-access memory (RRAM), conductive bridging random-access memory (CBRAM), ferro-electric random-access memory (Fe-RAM), etc. Even though the presently disclosed techniques can employ separable as well as non-separable error-correcting codes, for clarity the presently disclosed techniques are described in terms of separable error-correcting codes, only, where the error-correcting code functionality uses dedicated error-correcting code bits (sometimes called check bits), which are stored along with actual data bits within a memory device. When a write operation of new data is performed to the memory device, the error-correcting code functionality stores the new data along with one or more error-correcting code bits that can be used to detect and/or correct a certain number of erroneous bits comprising the new data. When a read operation of the new data is performed, the error-correcting code functionality can use the one or more error-correcting code bits to detect and/or correct a certain number of erroneous bits storing the new data being read. An erroneous bit is a bit that has an incorrect value, such as where the bit is storing a logical "1" when the bit should be storing a logic "0" or vice versa. This can occur when the bit has a value, such as a voltage or current value, on the wrong side of a threshold used to distinguish between the logical "1" and the logical "0". This especially can occur when the bit has a value, such as a voltage or current value, near a threshold used to distinguish between the logical "1" and the logical "0". Thus, the value may sometimes be read as the logical "1" and may sometimes be read as the logical "0" due to being so close to the threshold or for some other reasons.

Different types of error-correcting code functionality can detect and/or correct different numbers of erroneous bits from a set of bits. This limits the effectiveness and reliability of a memory device, such as where an error-correcting code functionality can only detect up to 2 erroneous bits and can correct only 1 erroneous bit. Unfortunately, improving the ability of error-correcting code functionality to detect and/or correct more erroneous bits may require larger error correcting components and/or storage of more error-correcting code bits, which may increase the size of an integrated circuit comprising an error correcting component.

As provided herein, candidate bits are identified within the memory device and used to improve error correction. A candidate bit may comprise a bit that is more likely to be unreliable compared to other bits. In an embodiment, the candidate bits are used to improve the ability of error-correcting code functionality to correctly identify erroneous bits by determining whether erroneous bits detected by the error-correcting code functionality are also candidate bits or not. In an embodiment, the candidate bits are used to improve the ability of the error-correcting code functionality to correct more erroneous bits than what the error-correcting code functionality is normally capable of correcting, if no candidate bits are employed. In an embodiment, a relatively smaller error correcting module (with for example a relatively smaller number of check bits) can be implemented for a memory device that will have the same detection and/or correction capabilities of a relatively larger error correcting module because the candidate bits can be used to improve detection and/or correction capabilities of the smaller error correcting module.

B. Presented Techniques

Figure 1:
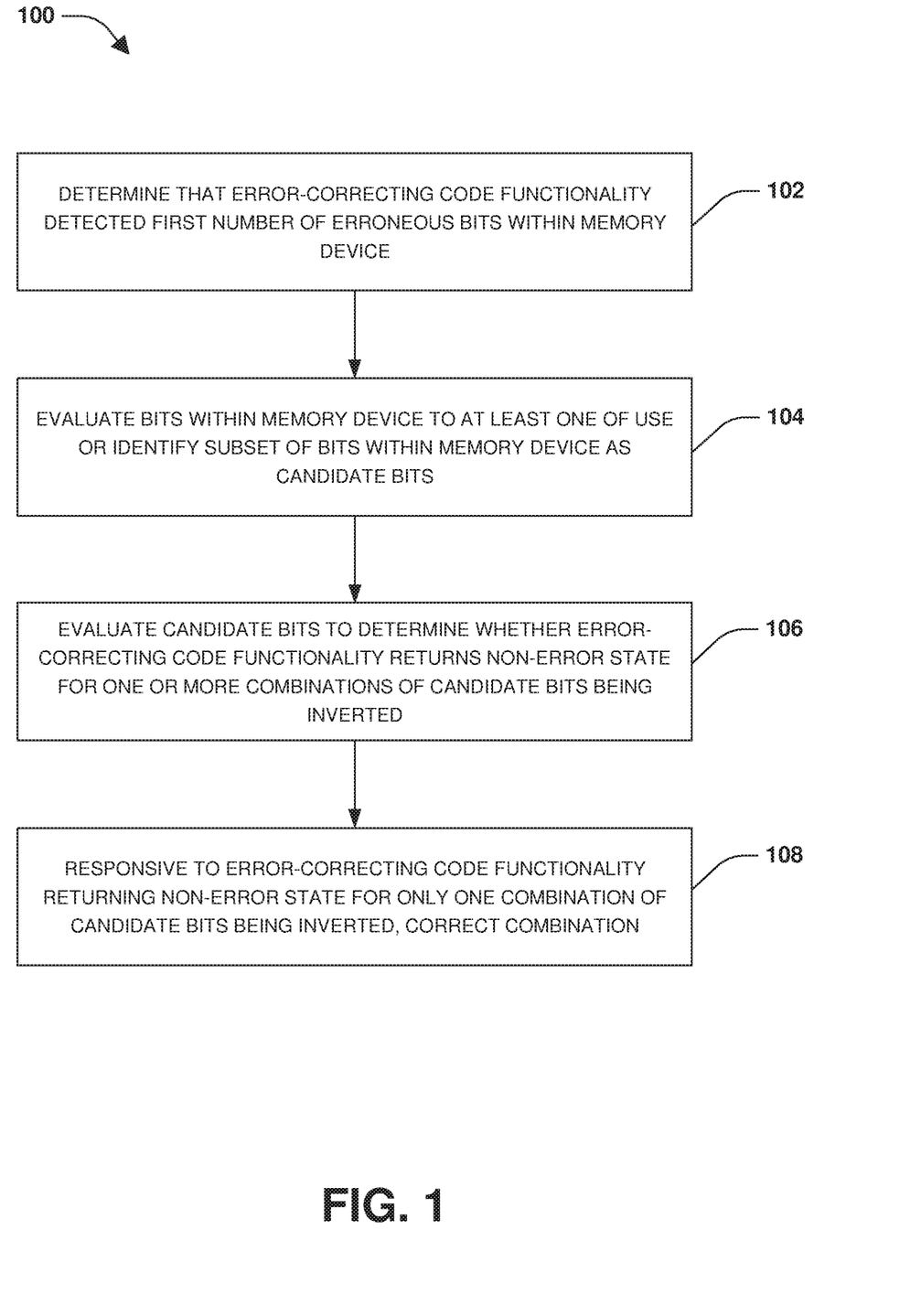
FIG. 1 is an illustration of an example method of for identifying and using candidate bits for error-correcting code functionality in accordance with the techniques presented herein.
Figure 2:
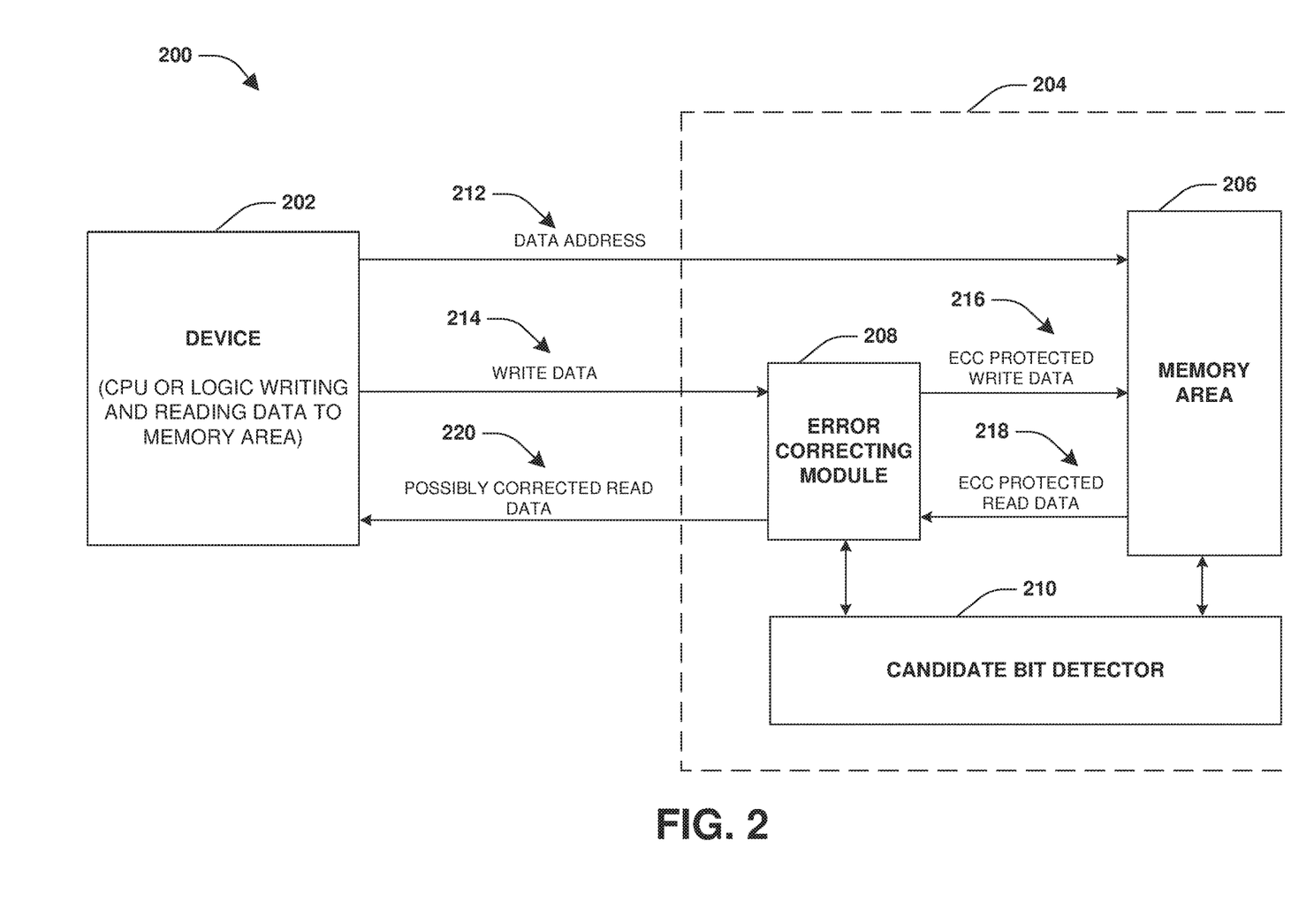
FIG. 2 is a component block diagram illustrating a device for identifying and using candidate bits for error-correcting code functionality in accordance with the techniques presented herein.
Figure 3A:
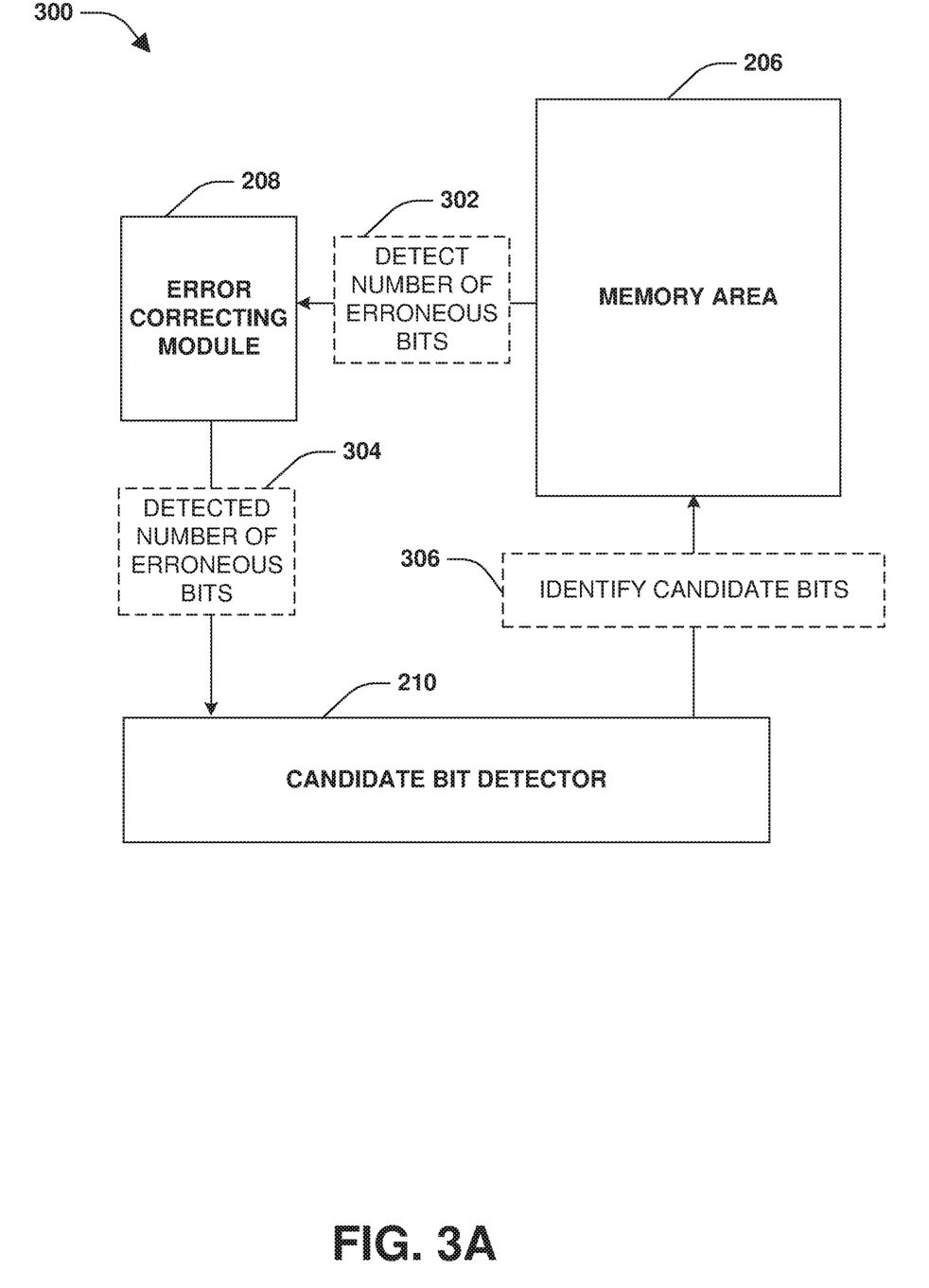
FIG. 3A is a component block diagram illustrating a device for identifying candidate bits for error-correcting code functionality in accordance with the techniques presented herein.
Figure 3B:
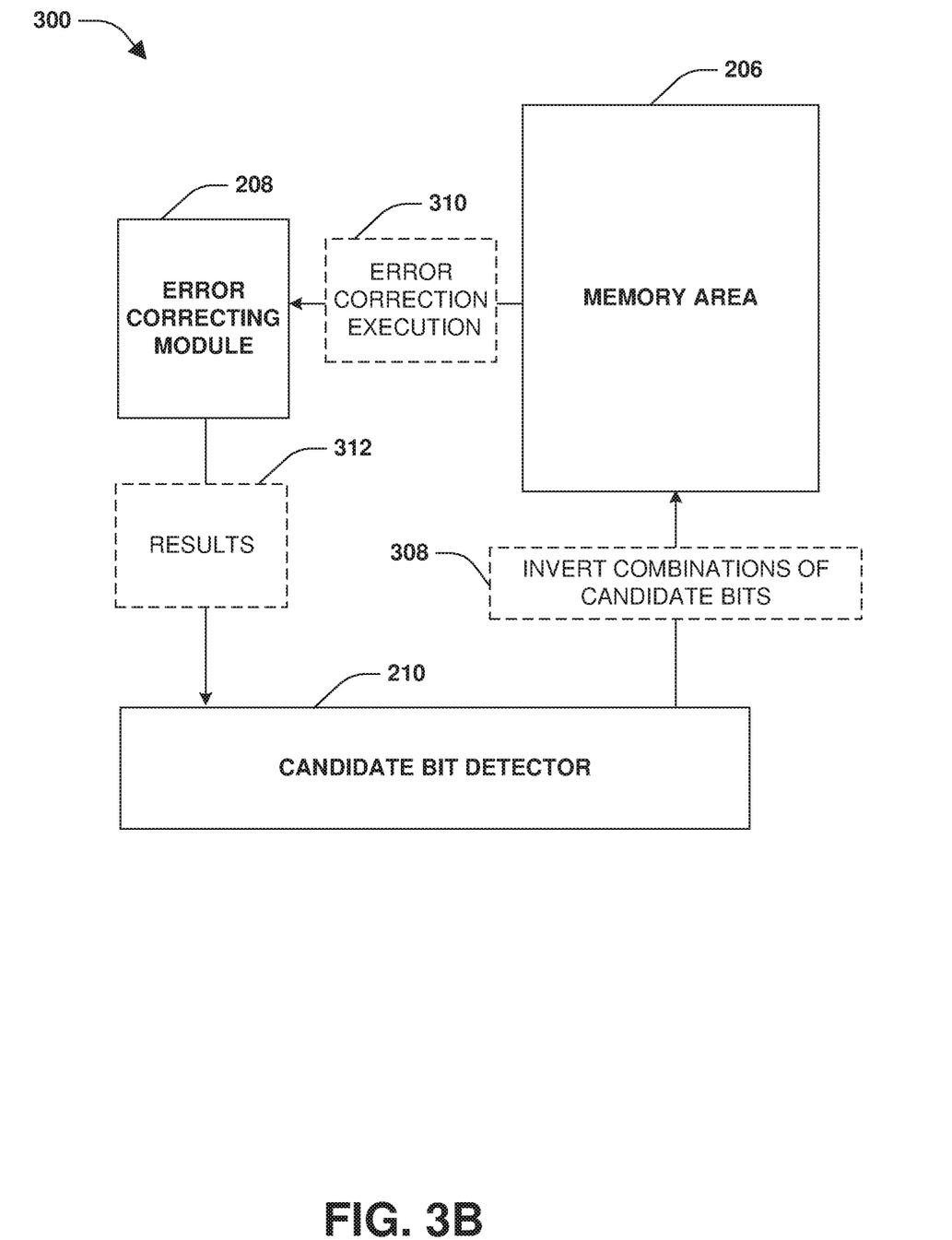
FIG. 3B is a component block diagram illustrating a device for using candidate bits for error-correcting code functionality in accordance with the techniques presented herein.

An embodiment of detecting and using candidate bits for error correcting of erroneous bits within a memory device is illustrated by an exemplary method 100 of FIG. 1 and further described in conjunction with system 200 of FIG. 2 and system 300 of FIGS. 3A and 3B. A device 202, such as a processor or other logic, may write data to and read data from a memory device 204. In an embodiment, the memory device 204 may be integrated into the device 202 such as within a single integrated circuit. In an embodiment, the memory device 204 is not integrated into the device 202 and is instead communicatively coupled to the device 202 through one or more data connections. The memory device 204 comprises a memory area 206 within which data can be stored by the device 202. Data can be stored within bits of the memory area 206, such as data written by the device 202 into data bits and error-correcting code bits written by an error correcting module 208 into the memory area 206.

The error correcting module 208 may implement error-correcting code functionality. The error correcting module 208 is implemented through software, hardware, or a combination of software and hardware of the memory device 204 or of a device external to the memory device 204. The error correcting module 208 is configured to detect a certain number of erroneous bits of a set of bits and correct a certain number of detected erroneous bits. In an embodiment, the error correcting module 208 can detect up to 2 erroneous bits and correct up to 1 erroneous bit using error-correcting code bits stored in association with the set of bits. In an embodiment, the error correcting module 208 can detect up to 4 erroneous bits and correct up to 2 erroneous bits.

When the device 202 writes data 214 to the memory area 206 of the memory device 204 using a write operation, the device 202 transmits data address information 212 to the memory device 204 specifying where the data 214 of the write operation is to be written. The device 202 transmits the data 214 of the write operation to the memory device 204. The error correcting module 208 of the memory device 204 receives the data 214. The error correcting module 208 executes logic or other functionality to create error-correcting code bits for the data 214, which can be subsequently used to identify and/or correct erroneous bits storing the data 214. The error correcting module 208 stores the data 214 and the error-correcting code bits as protected data 216 into the memory area 206.

When the device 202 reads data 220 from the memory area 206 using a read operation, the device 202 transmits the data address information 212 to the memory device 204 specifying where the data 220 of the read operation is to be read from the memory area 206. The error correcting module 208 will read the data 218 from the memory area 206 and execute the error-correcting code functionality upon the data 218 and error-correcting code bits for the data 218 to detect and/or correct any erroneous bits in the data 220. An erroneous bit is where an incorrect value is being stored and/or read from a bit within the memory area 206.

Because the error correcting module 208 can only detect a certain number of erroneous bits and correct a certain number of erroneous bits, a candidate bit detector 210 is provided herein for improving the detection and/or correction of erroneous bits by the error correcting module 208, as illustrated by system 300 of FIGS. 3A and 3B. In an embodiment, the candidate bit detector 210 is implemented through software, hardware, or a combination of software and hardware of the memory device 204 or of a device external to the memory device 204. In an embodiment, the candidate bit detector 210 is implemented as a finite state machine.

At 102, a determination 304 is made that the error correcting module 208 detected a first number of erroneous bits 302 from within the memory device 204 such as within the memory area 206 during execution of a read operation, as illustrated by FIG. 3A. In an embodiment, the error correcting module 208 executed error-correcting code functionality is capable of detecting up to 3 erroneous bits and correcting up to 2 erroneous bits. It may be appreciated that various types of error-correcting code functionality capable of detecting and/or correcting various numbers of erroneous bits may be employed by the error correcting module 208.

In an example, the error-correcting code functionality may have detected 3 erroneous bits as the first number of erroneous bits 302. The 3 erroneous bits may have been detected from a set of bits being read from the memory area 206 as part of the read operation executed by the device 202.

At 104, bits within the memory device 204, such as the set of bits being read from the memory area 206 by the read operation, are evaluated by the candidate bit detector 210 to at least one of use (e.g., use pre-identified unreliable bits) or identify a subset of bits within the memory device 204 as candidate bits 306. A candidate bit comprises a bit having a greater likelihood of being unreliable than other bits. It may be appreciated that a variety of techniques can be implemented to identify the candidate bits 306. In an embodiment of identifying the candidate bits 306 using a re-read technique, the candidate bit detector 210 performs a first read of a bit to determine a first value of the bit. For example, the first read of the bit reads a logical "0" value. The candidate bit detector 210 performs a second read of the bit to determine a second value of the bit. The first read operation and the second read operation are performed to measure either a current or voltage of the bit as the first value and the second value. In an embodiment, a current or voltage reading above a reference threshold may be determined to be a logical "1" value while a current or voltage reading below the reference threshold may be determined to be a logical "0" value.

The bit is determined to not be a candidate bit if the second value is the same as the first value, such as where both the first value and the second value are the logical "0" value. The bit is determined to be a candidate bit if the second value is different than the first value, such as where the second value is a logical "1" value while the first value is the logical "0" value. This means that the candidate bit is unreliable because the candidate bit has a current or voltage value that is close to the reference threshold, and thus is "flipping" between the logical "1" value and the "0" value for different read operations due to the current or voltage value being so close to the reference threshold. This re-read technique is performed for other bits, such as all of the bits within the set of bits being read by the read operation.

In an embodiment of identifying the candidate bits 306 using a re-read with hard read technique, read operations are performed using multiple thresholds. Each read operation may be performed with a different threshold that is shifted slightly greater than and slightly less than the reference threshold normally used to determine whether a read value is a logical "1" value or a logical "0" value. This allows for the detection of bits that may be storing a value close to the reference threshold, which may be unreliable due to being susceptible to being easily flipped. Accordingly, a first read of a bit is performed to determine a first value of the bit based upon a first threshold different than the reference threshold, such as greater than the reference threshold. A second read of the bit is performed to determine a second value using a second threshold different than the first threshold and the reference threshold, such as a threshold less than the reference threshold. The first threshold and the second threshold may be different current thresholds or different voltage thresholds.

The bit is determined to not be a candidate bit if the second value is the same as the first value, such as where both the first value and the second value are the logical "0" value. The bit is determined to be a candidate bit if the second value is different than the first value, such as where the second value is a logical "1" value while the first value is the logical "0" value. This means that the candidate bit is unreliable because the candidate bit has a current or voltage value that is close to the reference threshold, and thus is "flipping" between the logical "1" value and the "0" value for different read operations due to the current or voltage value being so close to the reference threshold. This re-read with hard read technique is performed for other bits, such as all of the bits within the set of bits being read by the read operation.

In an embodiment of identifying the candidate bits 306, timing metrics, such as a measurement or count of time, are used to identify the candidate bits 306. An access operation to a bit is performed to measure a timing metric associated with the access operation. The timing metric may correspond to a discharge time corresponding to a time for the bit to discharge (e.g., where the bit is represented by a state of a memory cell that is employed to (dis)charge some capacitance such that the state of the memory cell is modulating the time required for (dis)charging this capacitance, where this capacitance may correspond to a circuit element such as a capacitor or a parasitic capacitance of another circuit element). The timing metric may correspond to a charge time corresponding to a time for the bit to charge. It may be appreciated that other types of time domain measurements may be measured as the timing metric. The timing metric may be compared to a threshold used to distinguish between a first value and a second value such as between a logical "1" value and a logical "0" value. If the timing metric is within a threshold time of the threshold (e.g., relatively close to the threshold), then the bit is determined to be a candidate bit. This is because the bit may be susceptible to being flipped due to the timing metric being close to the threshold. Timing metrics may be measured and used to determine whether other bits are candidate bits 306, such as all of the bits within the set of bits being read by the read operation.

Once the candidate bits 306 are identified, the candidate bit detector 210 uses the candidate bits 306 to improve the ability of the error correcting module 208 to detect and/or correct erroneous bits, as illustrated by FIG. 3B. At 106, in one embodiment the candidate bits 306 are evaluated to determine whether the error-correcting code functionality returns a non-error state, where no error correction is performed, based upon one or more combinations of candidate bits being inverted. For each combination of candidate bits, the candidate bit detector 210 inverts 308 a combination of candidate bits. The error correction module 208 executes 310 the error-correcting code functionality upon bits within the memory area 206, such as the set of bits being read by the read operation. A result 312 of the error correction module 208 executing the error-correcting code functionality indicates whether error correction was invoked because the bits did not appear to be correct when evaluated by the error-correcting code functionality or whether no error correction was invoked because the bits appeared to be correct. If no error correction was invoked, and thus a non-error state is returned, for a combination of candidate bits being inverted, then the candidate bits are determined to be one solution of erroneous bits that could be in need of being corrected. As will be discussed later, non-candidate bits may also be inverted with one or more candidate bits to see if a non-error state (no error correction being invoked) or an error state (error correction being invoked) is returned.

Because one or more combinations of candidate bits may be identified and inverted, the error correcting module 208 may execute the error-correcting code functionality for each combination. At 108, if the error-correcting code functionality returned the non-error state for exactly one combination of candidate bits being inverted, then the combination of the candidate bits is corrected, such as inverted. In an embodiment, if the non-error state is returned for more than one combination of candidate bits being inverted, then the first number of erroneous bits 302 is flagged as being uncorrectable such as where the first number of erroneous bits 302 is greater than a number of bits capable of being corrected by the error correcting module 208. In an embodiment, if the non-error state is returned for more than one combination of candidate bits, then one of the combinations is selected, such as randomly selected, to correct.

Various logic and considerations are taken into account based upon whether the number of candidate bits 306 detected by the candidate bit detector 210 is the same, greater than, or less than the first number of erroneous bits 302 detected by the error correcting module 208.

In an embodiment, a count of the candidate bits 306 determined by the candidate bit detector 210 is determined to be equal to the first number of erroneous bits 302 detected by the error correcting module 208. Accordingly, the candidate bits 306 are inverted, and the error correcting module 208 executes the error-correcting code functionality. Result 312 of the error-correcting code functionality being executed is evaluated to determine whether the non-error state where no error correction was performed or the error state where error correction was performed based upon the candidate bits being inverted occurred. If the non-error state is returned, then the candidate bits are corrected by inverting the candidate bits. If the error state is returned, then the candidate bits are not inverted, and the first number of erroneous bits 302 are flagged as being uncorrectable.

In an embodiment, the count of the candidate bits 306 determined by the candidate bit detector 210 is determined to be less than the first number of erroneous bits 302 detected by the error correcting module 208. Because less candidate bits were identified than erroneous bits detected, all candidate bits 306 along with combinations of non-candidate bits are inverted to determine whether the error correcting module 208 returns the non-error state or the error state for each combination of all candidate bits 306 being inverted and select non-candidate bits being inverted. In an embodiment, the number of non-candidate bits being inverted for each combination may be a difference between the count of the candidate bits 306 and the first number of erroneous bits. For each combination of all candidate bits 306 being inverted and a combination of non-candidate bits being inverted, a determination is made as to whether the error-correcting code functionality returns the non-error state where no error correction is performed. If the error-correcting code functionality returns the non-error state for only one combination of all the candidate bits 306 being inverted and a combination of non-candidate bits being inverted, then all the candidate bits 306 and the combination of non-candidate bits are corrected, such as by being inverted.

In an embodiment, if the error-correcting code functionality returns the non-error state for more than one combination of all candidate bits being inverted and combinations of non-candidate bite being inverted, then the first number of erroneous bits 302 are flagged as uncorrectable or one combination is selected such as at random for being corrected. If the error-correcting code functionality does not return the non-error state for at least one combination of all candidate bits being inverted and combinations of non-candidate bite being inverted, then the first number of erroneous bits 302 are flagged as uncorrectable.

In an embodiment where the count of the candidate bits 306 is less than the first number of erroneous bits, the candidate bits 306 are inverted. A determination is made as to whether the error-correcting code functionality returns the non-error state when select non-candidate bits are inverted by the error-correcting code functionality while the candidate bits 306 are inverted. In this embodiment, the determination is made as to whether the error-correcting code functionality can correct the data by only inverting non-candidate bits without inverting back any candidate bits. If so, then the candidate bits in combination with the bits corrected by the error-correcting code functionality are corrected, otherwise, the first number of erroneous bits 302 are flagged as being uncorrectable.

In an embodiment, the count of the candidate bits 306 determined by the candidate bit detector 210 is determined to be greater than the first number of erroneous bits 302 detected by the error correcting module 208. Accordingly, combinations of candidate bits are inverted to see if the error-correcting code functionality returns the non-error state or the error state for any combination of the candidate bits being inverted. Responsive to the error-correcting code functionality returning the non-error state for more than one combination of the candidate bits being inverted, the first number of erroneous bits 302 are flagged as being uncorrectable or one combination is selected such as at random for being corrected. Responsive to the error-correcting code functionality not returning the non-error state for any combination of the candidate bits being inverted, the first number of erroneous bits 302 are flagged as being uncorrectable. Responsive to the error-correcting code functionality returning the error state for every combination, the first number of erroneous bits 302 are flagged as uncorrectable. Responsive to the error-correcting code functionality returning the non-error state for only one combination of the candidate bits being inverted, the combination of candidate bits are corrected.

In an embodiment where the count of candidate bits 306 is greater than the first number of erroneous bits 302, a select candidate bit is inverted. The error-correcting code functionality is controlled to invert one or more other candidate bits other than the select candidate bit to determine whether the error-correcting code functionality returns the non-error state for the combination of the select candidate bit and the one or more other candidate bits inverted by the error-correcting code functionality. This is performed for each candidate bit where a single select candidate bit is inverted and the error-correcting code functionality is controlled to invert other candidate bits. If the error-correcting code functionality returns the non-error state for only a single combination of a select candidate bit being inverted and a combination of other candidate bits being inverted by the error-correcting code functionality, then the select candidate bit and the combination of other candidate bits are corrected.

In an embodiment of identifying and using the candidate bits 306, the error-correcting code functionality returns the non-error state for more than one combination of candidate bits. A new subset of bits within the memory device 204 may be used or identified as candidate bits. The new subset of bits may comprise fewer bits than the subset of bits originally identified as the candidate bits 306 (e.g., the new subset of bits comprises fewer bits than the count of candidate bits 306). The new subset of bits are used to determine whether the error correcting module 208 returns the non-error state or the error state for combinations of the new subset of bits being inverted using the techniques previously described. The new subset of bits comprise candidate bits that can be identified using the techniques previously described for identifying candidate bits.

In an embodiment of identifying and using the candidate bits 306, a determination is made that the error-correcting code functionality determined a set of erroneous bits within the memory device 204. Bits within the memory device 204 are evaluated to at least one of use or identify a subset of bits within the memory device 204 as candidate bits 306. A determination is made as to whether the set of erroneous bits are the same bits as the candidate bits 306. The greater the percentage of the set of erroneous bits being the same bits as the candidate bits 306, the more likely the error correcting module 208 correctly identified the erroneous bits as being faulty bits. The smaller the percentage of the set of erroneous bits being the same bits as the candidate bits 306, the less likely the error correcting module 208 correctly identified the erroneous bits as being faulty bits. If the likelihood that the error correcting module 208 was correct exceeds a threshold, then the set of erroneous bits are corrected, otherwise, the set of erroneous bits are not corrected and for instance the bits are flagged as being uncorrectable.

C. Technical Effects

The identification and utilization of candidate bits for error correction improves the accuracy and ability of error-correcting code functionality to detect and correct erroneous bits within a memory device. The accuracy of the error-correcting code functionality is improved because the candidate bits, which are identified as bits that are more likely than other bits to be erroneous or otherwise unreliable, can be used to verify whether erroneous bits detected by the error-correcting code functionality are candidate bits or not. The greater the percentage of the erroneous bits being the same bits as the candidate bits, the more likely the error-correcting code functionality correctly identified the erroneous bits as being faulty bits. The smaller the percentage of the erroneous bits being the same bits as the candidate bits, the less likely the error-correcting code functionality correctly identified the erroneous bits as being faulty bits. In this way, the error-correcting code functionality can be controlled to selectively correct or not correct the erroneous bits at a greater precision and accuracy based upon how many of the erroneous bits are candidate bits. This will avoid the error-correcting code functionality incorrectly correcting the erroneous bits that are actually not erroneous/faulty. Improving the accuracy of the error detecting abilities of the error-correcting code functionality will improve the reliability and quality of the memory device, an integrated circuit utilizing the memory device, and/or logic, components, and/or applications storing data within the memory device.

The use of candidate bits also improves the operation of the error-correcting code functionality by allowing the error-correcting code functionality to correct more erroneous bits than what the error-correcting code functionality is normally capable of correcting. In particular, the error-correcting code functionality is only capable of detecting a certain number of erroneous bits and correcting a certain number of erroneous bits, if no subset of candidate bits is identified. The detected erroneous bits can be supplemented with the candidate bits for further evaluation and correction of a total number of bits that may be greater than what the error-correcting code functionality is normally capable of correcting. Also, this allows a smaller and less capable error correcting module to be used to achieve a desired amount of erroneous bit correction because the candidate bits can be used to improve the ability of this error correction module to correct more erroneous bits than normal, such as a number of erroneous bits that only a larger error correction module is capable of correcting. This will reduce the size of integrated chips because relatively smaller error correction modules (with for example a relatively smaller number of check bits) can be used to achieve the same amount of erroneous bit correction.

D. Computing Environment

Still another embodiment involves a computer-readable medium comprising processor-executable instructions configured to apply the techniques presented herein. Such computer-readable media may include various types of communications media, such as a signal that may be propagated through various physical phenomena (e.g., an electromagnetic signal, a sound wave signal, or an optical signal) and in various wired scenarios (e.g., via an Ethernet or fiber optic cable) and/or wireless scenarios (e.g., a wireless local area network (WLAN) such as WiFi, a personal area network (PAN) such as Bluetooth, or a cellular or radio network), and which encodes a set of computer-readable instructions that, when executed by a processor of a device, cause the device to implement the techniques presented herein. Such computer-readable media may also include (as a class of technologies that excludes communications media) computer-readable memory devices, such as a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a CD-R, DVD-R, or floppy disc), encoding a set of computer-readable instructions that, when executed by a processor of a device, cause the device to implement the techniques presented herein.

Figure 4:
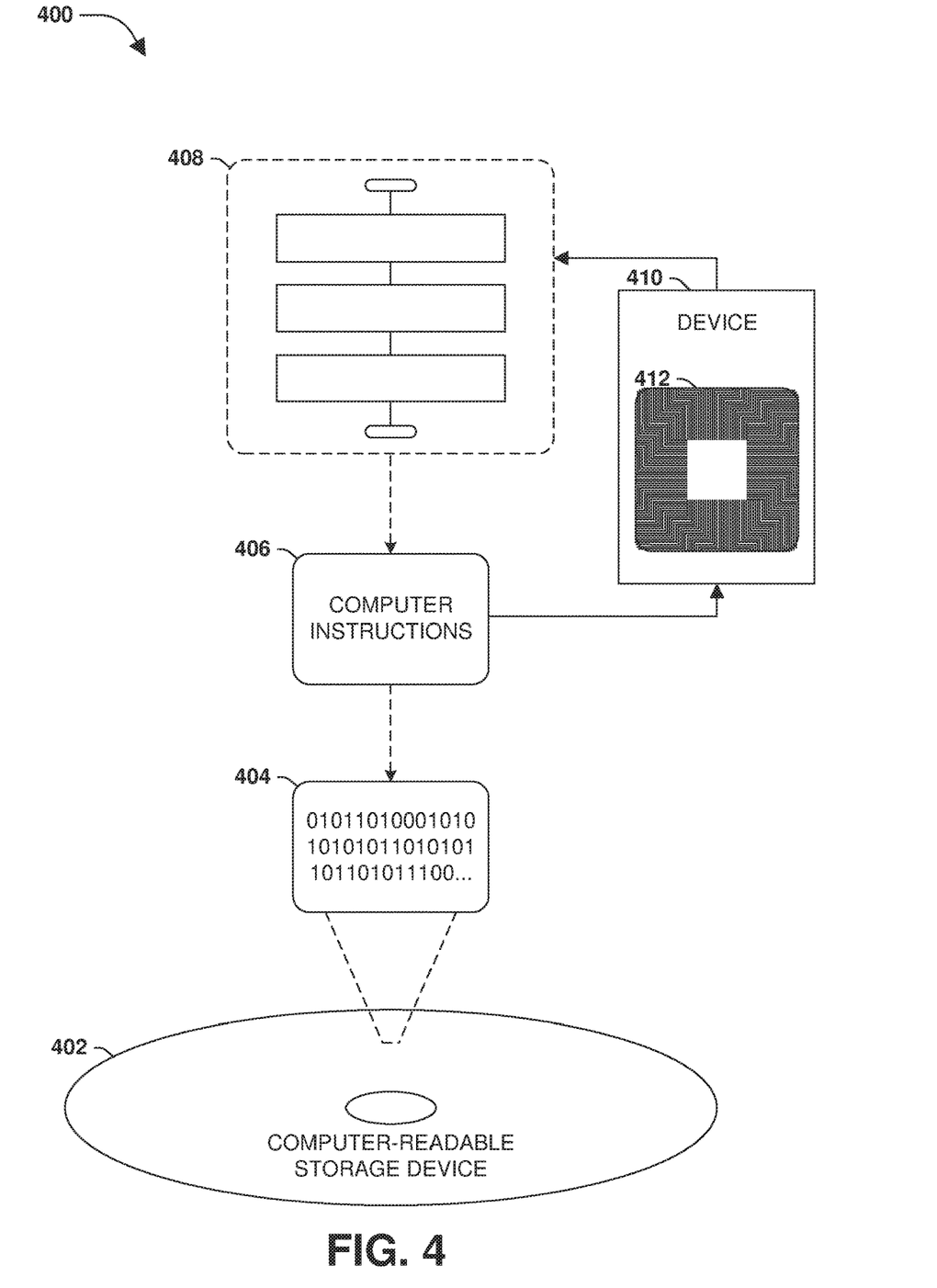
FIG. 4 is an example of a computer readable medium in which at least a portion of the currently presented techniques may be utilized.

An example computer-readable medium that may be devised in these ways is illustrated in FIG. 4, wherein the implementation 400 comprises a computer-readable memory device 402 (e.g., a CD-R, DVD-R, or a platter of a hard disk drive), on which is encoded computer-readable data 404. This computer-readable data 404 in turn comprises a set of computer instructions 406 that, when executed on a processor 412 of a device 410, provide an embodiment that causes the device 410 to operate according to the techniques presented forth herein. Many such computer-readable media may be devised by those of ordinary skill in the art that are configured to operate in accordance with the techniques presented herein. In some embodiments, the processor-executable computer instructions 406 are configured to perform a method 408, such as at least some of the exemplary method 100 of FIG. 1, for example. In some embodiments, the processor-executable computer instructions 404 are configured to implement a system, such as at least some of the exemplary system 200 of FIG. 2 and/or at least some of the exemplary system 300 of FIGS. 3A and 3B, for example. Many such computer-readable media are contemplated to operate in accordance with the techniques presented herein.

Figure 5:
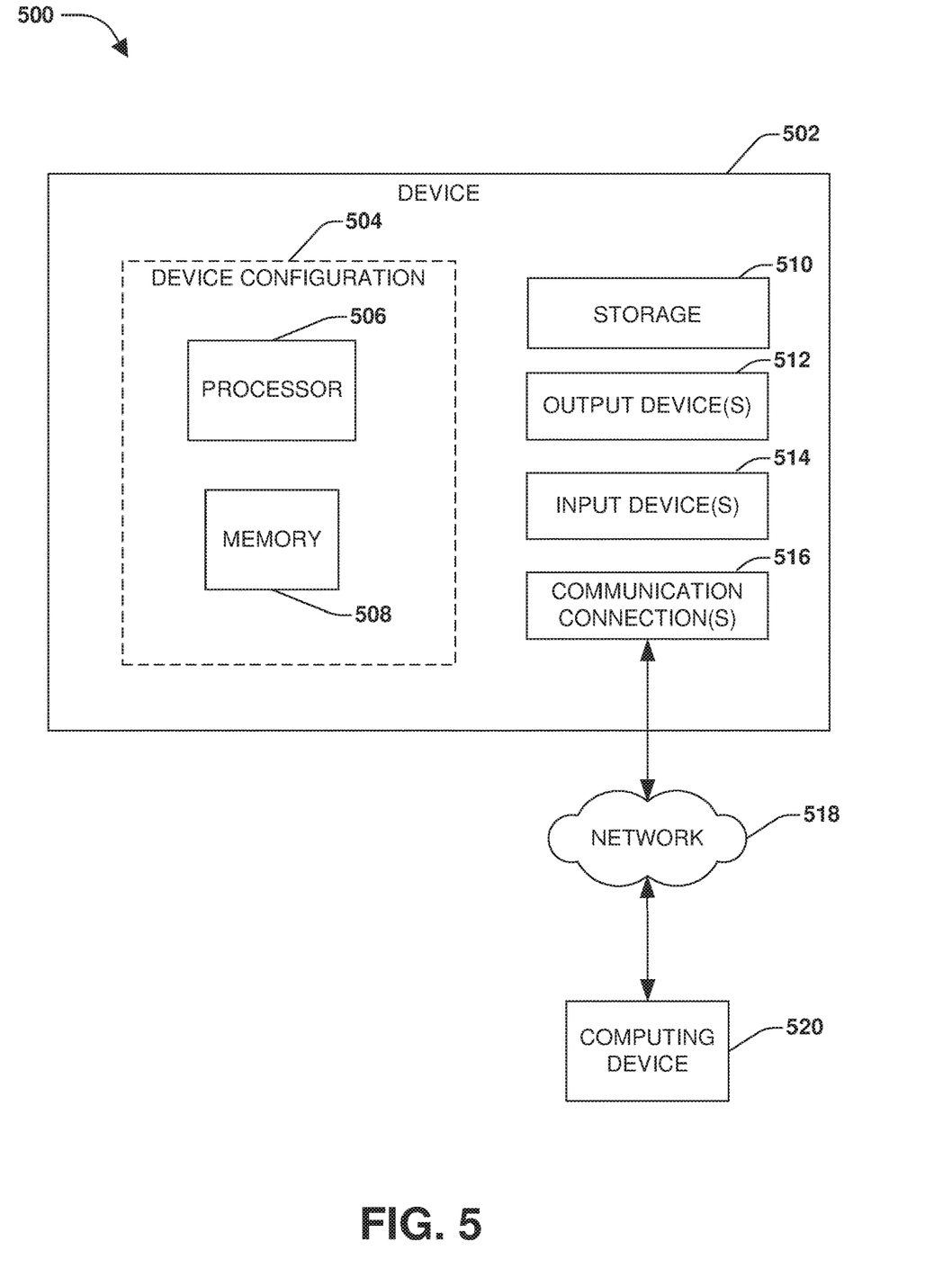
FIG. 5 is an illustration of an example computing environment wherein at least a portion of the currently presented techniques may be utilized.

FIG. 5 and the following discussion provide a brief, general description of a suitable computing environment to implement embodiments of one or more of the provisions set forth herein. The operating environment of FIG. 5 is only one example of a suitable operating environment and is not intended to suggest any limitation as to the scope of use or functionality of the operating environment. Example computing devices include, without limitation, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 5 illustrates an example 500 of a system comprising a computing device 502 configured to implement one or more embodiments provided herein. In one configuration, computing device 502 includes a processing unit 506 and memory 508. Depending on the exact configuration and type of computing device, memory 508 may be volatile (such as RAM, for example), non-volatile (such as ROM, flash memory, etc., for example), or some combination of the two. This configuration is illustrated in FIG. 5 by dashed line 504.

As provided herein, the candidate bit detector 210 can be employed for the memory 508 and/or storage 510 in order to improve the abilities of the error correcting module 208 to detect and/or correct erroneous bits within the memory 508 and/or the storage 510.

In some embodiments, device 502 may include additional features and/or functionality. For example, device 502 may also include additional storage (e.g., removable and/or non-removable) including, without limitation, magnetic storage, optical storage, and the like. Such additional storage is illustrated in FIG. 5 by storage 510. In one embodiment, computer readable instructions to implement one or more embodiments provided herein may be in storage 510. Storage 510 may also store computer readable instructions to implement an operating system, an application program, and the like. Computer readable instructions may be loaded in memory 508 for execution by processing unit 506, for example.

The term "computer readable media" as used herein includes computer storage media. Computer storage media includes volatile and nonvolatile, removable and non-removable media implemented in any method or technology for storage of information such as computer readable instructions or other data. Memory 508 and storage 510 are examples of computer storage media. Computer storage media includes, without limitation, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 502. Any such computer storage media may be part of device 502.

Device 502 may also include communication connection(s) 516 that allows device 502 to communicate with other devices. Communication connection(s) 516 may include, without limitation, a modem, a Network Interface Card (NIC), an integrated network interface, a radio frequency transmitter/receiver, an infrared port, a USB connection, or other interfaces for connecting device 502 to other computing devices. Communication connection(s) 516 may include a wired connection or a wireless connection. Communication connection(s) 516 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 502 may include input device(s) 514 such as keyboard, mouse, pen, voice input device, touch input device, infrared cameras, video input devices, and/or any other input device. Output device(s) 512 such as one or more displays, speakers, printers, and/or any other output device may also be included in device 502. Input device(s) 514 and output device(s) 512 may be connected to device 502 via a wired connection, wireless connection, or any combination thereof. In one embodiment, an input device or an output device from another computing device may be used as input device(s) 514 or output device(s) 512 for computing device 502.

Components of device 502 may be connected by various interconnects, such as a bus. Such interconnects may include a Peripheral Component Interconnect (PCI), such as PCI Express, a Universal Serial Bus (USB), Firewire (IEEE 1394), an optical bus structure, and the like. In an embodiment, components of device 502 may be interconnected by a network. For example, memory 508 may be comprised of multiple physical memory units located in different physical locations interconnected by a network.

Those skilled in the art will realize that storage devices utilized to store computer readable instructions may be distributed across a network. For example, a computing device 520 accessible via network 518 may store computer readable instructions to implement one or more embodiments provided herein. Computing device 502 may access the computing device 520 and download a part or all of the computer readable instructions for execution. Alternatively, computing device 502 may download pieces of the computer readable instructions, as needed, or some instructions may be executed at computing device 502 and some at computing device 520.

E. Claim Summary

An embodiment of the presently disclosed techniques comprises a method of identifying and using candidate bits for an error-correcting code functionality. The method comprises: determining that the error-correcting code functionality detected a first number of erroneous bits within a memory device, wherein the error-correcting code functionality can correct fewer than the first number of erroneous bits; evaluating bits within the memory device to at least one of use or identify a subset of bits within the memory device as candidate bits; evaluating the candidate bits to determine whether the error-correcting code functionality returns a non-error state, where no error correction is performed, based upon one or more combinations of candidate bits being inverted; and responsive to the error-correcting code functionality returning the non-error state for only one combination of the one or more combinations of candidate bits being inverted, correcting the one combination of the one or more combinations of candidate bits.

According to some embodiments, evaluating bits within the memory device to identify a subset of the bits as candidate bits comprises performing a first read of a bit to determine a first value of the bit; performing a second read of the bit to determine a second value of the bit; and selecting the bit as a candidate bit based upon the first value being different than the second value.

According to some embodiments, evaluating bits within the memory device to identify a subset of the bits as candidate bits comprises performing a first read of a bit to determine a first value of the bit based upon a first threshold; performing a second read of the bit to determine a second value of the bit based upon a second threshold; and selecting the bit as a candidate bit based upon the first value being different than the second value.

According to some embodiments, at least one of the first threshold correspond to current threshold and the second threshold corresponds to a current threshold, the first threshold corresponds to voltage threshold and the second threshold corresponds to a voltage threshold, or the first threshold corresponds to a current threshold and the second threshold corresponds to a voltage threshold.

According to some embodiments, the method comprises determining that the error-correcting code functionality returns the non-error state for more than one combination of candidate bits; and identifying a new subset of bits as candidate bits, wherein the new subset of bits comprises fewer bits than the subset of the bits.

According to some embodiments, evaluating bits within the memory device to identify a subset of the bits as candidate bits comprises: performing a read of a bit to measure a timing metric associated with the read; comparing the timing metric to a threshold used to distinguish between a first value and a second value; and selecting the bit as a candidate bit based upon the timing metric being within a threshold time of the threshold.

According to some embodiments, evaluating the candidate bits to determine whether the error-correcting code functionality returns the non-error state based upon one or more combinations of candidate bits being inverted comprises: determining that a count of the candidate bits is equal to the first number of erroneous bits detected by the error-correcting code functionality; inverting the candidate bits; and determining whether the error-correcting code functionality returns the non-error state based upon the candidate bits being inverted.

According to some embodiments, evaluating the candidate bits to determine whether the error-correcting code functionality returns the non-error state based upon one or more combinations of candidate bits being inverted comprises: determining that a count of the candidate bits is greater than the first number of erroneous bits detected by the error-correcting code functionality; and determining whether the error-correcting code functionality returns the non-error state based upon any combination of candidate bits being inverted.

According to some embodiments, the method comprises responsive to the error-correcting code functionality returning the non-error state for more than one combination of the one or more combinations of candidate bits being inverted, flagging the first number of erroneous bits as uncorrectable.

According to some embodiments, responsive to the error-correcting code functionality returning an error state, where error correction was performed, for every combination of the one or more combinations of candidate bits being inverted, flagging the first number of erroneous bits as uncorrectable.

According to some embodiments, evaluating the candidate bits to determine whether the error-correcting code functionality returns the non-error state based upon one or more combinations of candidate bits being inverted comprises: determining that a count of the candidate bits is less than the first number of erroneous bits detected by the error-correcting code functionality; inverting all candidate bits and combinations of non-candidate bits; and for a combination of the candidate bits being inverted and a combination of non-candidate bits being inverted, determining whether the error-correcting code functionality returns the non-error state; and the method comprises responsive to the error-correcting code functionality returning the non-error state for only one combination of the candidate bits being inverted and a combination of non-candidate bits being inverted, correcting the candidate bits being inverted and the combination of non-candidate bits being inverted.

According to some embodiments, responsive to the error-correcting code functionality returning the non-error state for more than one combination of all candidate bits being inverted and combinations of non-candidate bits being inverted, flagging the first number of erroneous bits as uncorrectable.

According to some embodiments, responsive to the error-correcting code functionality not returning the non-error state for at least one combination of all candidate bits being inverted and combinations of non-candidate bits being inverted, flagging the first number of erroneous bits as uncorrectable.

An embodiment of the presently disclosed techniques comprises an apparatus, comprising a means for determining that error-correcting code functionality detected a first number of erroneous bits within a memory device, wherein the error-correcting code functionality can correct fewer than the first number of erroneous bits; a means for evaluating bits within the memory device to at least one of use or identify a subset of bits within the memory device as candidate bits; a means for evaluating the candidate bits to determine whether the error-correcting code functionality returns a non-error state, where no error correction is performed, based upon one or more combinations of candidate bits being inverted; and a means for responsive to the error-correcting code functionality returning the non-error state for only one combination of the one or more combinations of candidate bits being inverted, correcting the one combination of the one or more combinations of candidate bits An embodiment of the presently disclosed techniques comprises a non-transitory machine readable medium comprising instructions for performing a method, which when executed by a machine, causes the machine to determine that error-correcting code functionality detected a first number of erroneous bits within a memory device, wherein the error-correcting code functionality can correct fewer than the first number of erroneous bits; evaluate bits within the memory device to at least one of use or identify a subset of bits within the memory device as candidate bits; evaluate the candidate bits to determine whether the error-correcting code functionality returns a non-error state, where no error correction is performed, based upon one or more combinations of candidate bits being inverted; and responsive to the error-correcting code functionality returning the non-error state for only one combination of the one or more combinations of candidate bits being inverted, correct the one combination of the one or more combinations of candidate bits.

According to some embodiments, the instructions cause the machine to determine that a count of the candidate bits is greater than the first number of erroneous bits detected by the error-correcting code functionality; and for each candidate bit invert a select candidate bit; and control the error-correcting code functionality to invert one or more other candidate bits than the select candidate bit to determine whether the error-correcting code functionality returns the non-error state for a combination of the select candidate bit and the one or more other candidate bits.

According to some embodiments, the instructions cause the machine to determine that a count of the candidate bits is less than the first number of erroneous bits detected by error-correcting code functionality; invert the candidate bits; determine whether the error-correcting code functionality returns the non-error state when select non-candidate bits are inverted by the error-correcting code functionality and the candidate bits are inverted; and correct the candidate bits and the select non-candidate bits.

According to some embodiments, the instructions cause the machine to determine that the error-correcting code functionality returns the non-error state for a plurality of combinations of candidate bits; and randomly select a combination of the plurality of combinations of candidate bits to correct.

An embodiment of the presently disclosed techniques comprises a device configured to determine that error-correcting code functionality detected a first set of erroneous bits within a memory device; evaluate bits within the memory device to at least one of use or identify a subset of bits within the memory device as candidate bits; determine whether the first set of erroneous bits are candidate bits; and determine a likelihood that the error-correcting code functionality incorrectly detected the first set of erroneous bits based upon a threshold number of the first set of erroneous bits not being candidate bits.

According to some embodiments, the device is implemented as a finite state machine.

According to some embodiments, the device is implemented as at least one of a hardware device or a software device.

F. Usage of Terms

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description.

Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
    determining that error-correcting code functionality detected a first number of erroneous bits within a memory device, wherein the error-correcting code functionality can correct fewer than the first number of erroneous bits;
    evaluating bits within the memory device to identify a first subset of bits within the memory device as a set of candidate bits, wherein a second subset of bits within the memory device are non-candidate bits;
    generating a first combination of candidate bits from the set of candidate bits;
    generating a second combination of candidate bits from the set of candidate bits;
    inverting candidate bits within the first combination of candidate bits to create a first combination of inverted candidate bits;
    inverting candidate bits within the second combination of candidate bits to create a second combination of inverted candidate bits;
    determining whether the error-correcting code functionality returns a non-error state where no error correction is performed for the first combination of inverted candidate bits;
    determining whether the error-correcting code functionality returns the non-error state for the second combination of inverted candidate bits; and
    if the error-correcting code functionality returns the non-error state for the first combination of inverted candidate bits but not the second combination of inverted candidate bits, then correcting, within the memory device, the first combination of inverted candidate bits but not the second combination of inverted candidate bits.

2. The method of claim 1, wherein evaluating bits within the memory device comprises:
    performing a first read of a bit to determine a first value of the bit;
    performing a second read of the bit to determine a second value of the bit; and
    selecting the bit as a candidate bit for inclusion within the set of candidate bits based upon the first value being different than the second value.

3. The method of claim 1, wherein evaluating bits within the memory device comprises:
    performing a first read of a bit to determine a first value of the bit based upon a first threshold;
    performing a second read of the bit to determine a second value of the bit based upon a second threshold; and
    selecting the bit as a candidate bit for inclusion within the set of candidate bits based upon the first value being different than the second value.

4. The method of claim 3, wherein at least one of:
    the first threshold corresponds to a first current threshold and the second threshold corresponds to a second current threshold,
    the first threshold corresponds to a first voltage threshold and the second threshold corresponds to a second voltage threshold, or
    the first threshold corresponds to a third current threshold and the second threshold corresponds to a third voltage threshold.

5. The method of claim 1, comprising:
    if the error-correcting code functionality returns the non-error state for both the first combination of inverted candidate bits and the second combination of inverted candidate bits, then identifying a new subset of bits within the memory device as a new set of candidate bits.

6. The method of claim 1, wherein evaluating bits within the memory device comprises:
    performing a read of a bit to measure a timing metric associated with the read;
    comparing the timing metric to a threshold used to distinguish between a first value and a second value; and selecting the bit as a candidate bit for inclusion within the set of candidate bits based upon the timing metric being within a threshold time of the threshold.

7. The method of claim 1, comprising:
determining that a count of the candidate bits within the set of candidate bits is equal to the first number of erroneous bits detected by the error-correcting code functionality;
inverting the candidate bits within the set of candidate bits as a set of inverted candidate bits; and
determining whether the error-correcting code functionality returns the non-error state for the set of inverted candidate bits.

8. The method of claim 5, wherein the new subset of bits comprises fewer bits than the first subset of bits.

9. The method of claim 1, comprising:
if the error-correcting code functionality returns the non-error state for both the first combination of inverted candidate bits and the second combination of inverted candidate bits, then flagging the first number of erroneous bits as uncorrectable.

10. The method of claim 1, comprising:
if the error-correcting code functionality returns an error state where error correction was performed for both the first combination of inverted candidate bits and the second combination of inverted candidate bits, then flagging the first number of erroneous bits as uncorrectable.

11. The method of claim 3, wherein the first threshold corresponds to a first current threshold and the second threshold corresponds to a second current threshold.

12. The method of claim 3, wherein the first threshold corresponds to a first voltage threshold and the second threshold corresponds to a second voltage threshold.

13. The method of claim 3, wherein the first threshold corresponds to a first current threshold and the second threshold corresponds to a first voltage threshold.

14. A non-transitory machine readable medium comprising instructions, which when executed by a machine, cause the machine to:
determine that error-correcting code functionality detected a first number of erroneous bits within a memory device, wherein the error-correcting code functionality can correct fewer than the first number of erroneous bits;
evaluate bits within the memory device to identify a first subset of bits within the memory device as candidate bits, wherein a second subset of bits within the memory device are non-candidate bits;
evaluate the candidate bits to determine whether the error-correcting code functionality returns a non-error state where no error correction is performed based upon one or more combinations of candidate bits being inverted;
if the error-correcting code functionality returns the non-error state for one combination of the one or more combinations of candidate bits being inverted, then correcting, within the memory device, the one combination of the one or more combinations of candidate bits; and
if the error-correcting code functionality returns the non-error state for more than one combination of the one or more combinations of candidate bits being inverted, then identifying a new subset of bits within the memory device as new candidate bits, wherein the new subset of bits comprises fewer bits than the first subset of bits.

15. The non-transitory machine readable medium of claim 14, wherein the instructions cause the machine to:
evaluate bits within the memory device by:
performing a first read of a bit to determine a first value of the bit;
performing a second read of the bit to determine a second value of the bit; and
selecting the bit as a candidate bit based upon the first value being different than the second value.

16. The non-transitory machine readable medium of claim 14, wherein the instructions cause the machine to:
evaluate bits within the memory device by:
performing a first read of a bit to determine a first value of the bit based upon a first threshold;
performing a second read of the bit to determine a second value of the bit based upon a second threshold; and
selecting the bit as a candidate bit based upon the first value being different than the second value.

17. The non-transitory machine readable medium of claim 16, wherein at least one of:
the first threshold corresponds to a first current threshold and the second threshold corresponds to a second current threshold,
the first threshold corresponds to a first voltage threshold and the second threshold corresponds to a second voltage threshold, or
the first threshold corresponds to a third current threshold and the second threshold corresponds to a third voltage threshold.

18. A device configured to:
determine that error-correcting code functionality detected a first set of erroneous bits within a memory device;
evaluate bits within the memory device to identify a first subset of bits within the memory device as candidate bits, wherein a second subset of bits within the memory device are non-candidate bits;
evaluate the candidate bits to determine whether the error-correcting code functionality returns a non-error state where no error correction is performed based upon one or more combinations of candidate bits being inverted;
if the error-correcting code functionality returns the non-error state for one combination of the one or more combinations of candidate bits being inverted, then correcting, within the memory device, the one combination of the one or more combinations of candidate bits; and
if the error-correcting code functionality returns the non-error state for more than one combination of the one or more combinations of candidate bits being inverted, then identifying a new subset of bits within the memory device as new candidate bits, wherein the new subset of bits comprises fewer bits than the first subset of bits.

19. The device of claim 18, wherein the device is implemented as a finite state machine.

20. The device of claim 18, wherein the device is implemented as at least one of a hardware device or a software device.

* * * * *